United States Patent
Toyoda et al.

(10) Patent No.: US 9,070,554 B2
(45) Date of Patent: Jun. 30, 2015

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Kazuyuki Toyoda, Toyama (JP); Yukitomo Hirochi, Toyama (JP); Tetsuo Yamamoto, Toyama (JP); Kazuhiro Morimitsu, Toyama (JP); Tadashi Takasaki, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/495,388

(22) Filed: Sep. 24, 2014

(65) Prior Publication Data

US 2015/0093913 A1    Apr. 2, 2015

(30) Foreign Application Priority Data

Sep. 30, 2013  (JP) ................................ 2013-204730
Mar. 20, 2014  (JP) ................................ 2014-058276

(51) Int. Cl.
| | |
|---|---|
| H01L 21/31 | (2006.01) |
| H01L 21/469 | (2006.01) |
| H01L 21/02 | (2006.01) |
| C23C 16/511 | (2006.01) |
| C23C 16/52 | (2006.01) |
| C23C 16/455 | (2006.01) |
| H01L 21/67 | (2006.01) |

(52) U.S. Cl.
CPC ........ *H01L 21/02252* (2013.01); *C23C 16/511* (2013.01); *C23C 16/52* (2013.01); *C23C 16/45557* (2013.01); *C23C 16/45523* (2013.01); *H01L 21/02312* (2013.01); *H01L 21/67017* (2013.01)

(58) Field of Classification Search
USPC .......... 438/770, 771, 775, 776, 788, 792, 769
See application file for complete search history.

(56) References Cited

U.S. PATENT DOCUMENTS

| | | | | |
|---|---|---|---|---|
| 5,302,555 A | * | 4/1994 | Yu ................................. | 438/786 |
| 6,194,038 B1 | * | 2/2001 | Rossman ...................... | 427/569 |
| 6,232,663 B1 | | 5/2001 | Taniguchi et al. | |
| 7,314,838 B2 | * | 1/2008 | Tsai et al. ..................... | 438/798 |
| 2011/0014795 A1 | | 1/2011 | Lee et al. | |

FOREIGN PATENT DOCUMENTS

| | | |
|---|---|---|
| JP | 10-173052 A | 6/1998 |
| JP | 2007-016277 A | 1/2007 |
| JP | 4068204 B2 | 1/2008 |
| JP | 2008-192975 A | 8/2008 |
| JP | 2011-023718 A | 2/2011 |

* cited by examiner

*Primary Examiner* — Karen Kusumakar

(74) *Attorney, Agent, or Firm* — Volpe and Koenig, P.C.

(57) ABSTRACT

A method of manufacturing a semiconductor device includes supplying a precursor gas to a substrate; supplying a reaction gas to a plasma generation region; supplying high frequency power to the plasma generation region; and generating plasma of the reaction gas by adjusting a pressure of the plasma generation region to a first pressure before the reaction gas is supplied and adjusting the pressure of the plasma generation region to a second pressure lower than the first pressure while the reaction gas and the high frequency power are supplied.

19 Claims, 7 Drawing Sheets

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japanese Patent Application Nos. 2013-204730, filed on Sep. 30, 2013, and 2014-058276, filed on Mar. 20, 2014, the entire contents of which are incorporated herein by reference.

TECHNICAL FIELD

The present disclosure relates to a method of manufacturing a semiconductor device, a substrate processing apparatus and a recording medium.

BACKGROUND

With an increase in density of a large scale integrated circuit (hereinafter, referred to as an LSI), a circuit pattern has been miniaturized.

In order to integrate a large number of semiconductor devices into a small area, the semiconductor devices must be formed to be small in size. To this end, a width and a space of a pattern to be formed should be made small.

With the current trend for miniaturization, oxide embedded in a fine structure, particularly, in a narrow void structure (groove) which is deep in a vertical direction and narrow in a width direction has reached its technical limits when the embedding of the oxide is performed by a CVD method. In addition, with the miniaturization of transistors, a thin and uniform gate insulating film or gate electrode is required to be formed. Further, it is required to reduce a processing time for one substrate in order to improve productivity of semiconductor devices.

Since a minimal processing size of a semiconductor device required by a latest LSI, DRAM (Dynamic Random Access Memory), or flash memory is being less than 30 nm in width, the miniaturization, improved manufacturing throughput, or low processing temperature becomes difficult while maintaining the quality. For example, when a gate insulating film or a gate electrode is formed, a film forming method in which a process of supplying and exhausting a precursor gas, a process of supplying and exhausting a reaction gas, and a process of generating plasma are sequentially repeated is used. In this film forming method, for example, when plasma is generated, it takes time to control electric power, pressure, gas concentration, and the like, and thus, it is difficult to improve a manufacturing throughput.

SUMMARY

The present disclosure provides some embodiments of a method of manufacturing a semiconductor device, a substrate processing apparatus and a recording medium, which makes it possible to improve properties of a film formed on a substrate and to increase a manufacturing throughput.

According to an aspect of the present disclosure, there is provided a method of manufacturing a semiconductor device, including: supplying a precursor gas to a substrate; supplying a reaction gas to a plasma generation region; supplying high frequency power to the plasma generation region; and generating plasma of the reaction gas by adjusting a pressure of the plasma generation region to a first pressure before the reaction gas is supplied and adjusting the pressure of the plasma generation region to a second pressure lower than the first pressure while the reaction gas and the high frequency power are supplied.

According to another aspect of the present disclosure, there is provided a substrate processing apparatus, including: a process chamber having a substrate accommodated therein; a precursor gas supply part configured to supply a precursor gas to the substrate; a reaction gas supply part configured to supply a reaction gas to the substrate; a plasma generation region which the reaction gas is supplied to and the reaction gas is converted to a plasma state in; an exciting part configured to supply high frequency power to the plasma generation region; and a control part configured to control the reaction gas supply part and the exciting part such that the reaction gas is excited into the plasma state by adjusting a pressure of the plasma generation region to a first pressure before the reaction gas is supplied and adjusting the pressure of the plasma generation region to a second pressure lower than the first pressure while the reaction gas and the high frequency power are supplied.

According to still another aspect of the present disclosure, there is provided a non-transitory computer-readable recording medium storing a program that causes a computer to perform processes of: supplying a precursor gas to a substrate; supplying a reaction gas to a plasma generation region; supplying high frequency power to the plasma generation region; and generating plasma of the reaction gas by adjusting a pressure of the plasma generation region to a first pressure before the reaction gas is supplied and adjusting the pressure of the plasma generation region to a second pressure lower than the first pressure while the reaction gas and the high frequency power are supplied.

DETAILED DESCRIPTION

Embodiments of the present disclosure will be described below.

Embodiment of the Present Disclosure

Hereinafter, an embodiment of the present disclosure will be described with reference to the drawings.

(1) Configuration of Substrate Processing Apparatus

First, a substrate processing apparatus 100 according to an embodiment of the present disclosure will be described.

Figure 1:
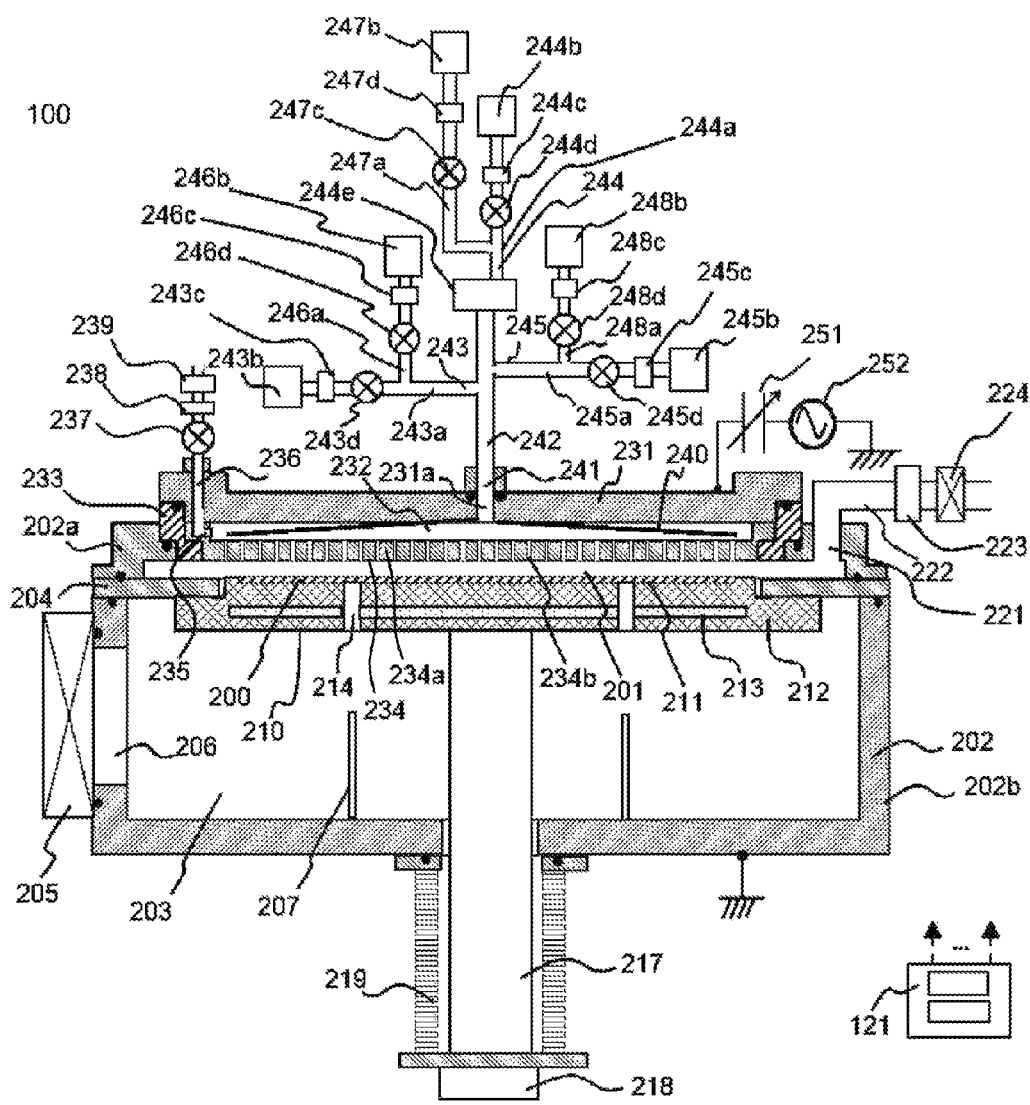
FIG. 1 is a schematic view illustrating a configuration of a substrate processing apparatus according to an embodiment of the present disclosure.

The substrate processing apparatus 100 is a unit of forming an insulating film having a high dielectric constant and is configured as a single-wafer type substrate processing apparatus, as shown in FIG. 1.

As shown in FIG. 1, the substrate processing apparatus 100 is provided with a process vessel 202. The process vessel 202 is configured, for example, as a flat airtight vessel having a circular horizontal cross section. In addition, the process vessel 202 is made, for example, of metal, such as aluminum (Al) or stainless steel (SUS), or quartz. A process space (process chamber) 201, in which a wafer 200 such as a silicon wafer as a substrate is processed, and a transfer space 203 are defined in the process vessel 202. The process vessel 202 consists of an upper vessel 202a and a lower vessel 202b. A partition plate 204 is installed between the upper vessel 202a and the lower vessel 202b. A space above the partition plate 204, as a space surrounded by the upper vessel 202a, is referred to as the process chamber 201, and a space below the partition plate 204, as a space surrounded by the lower vessel 202b, is referred to as the transfer space 203.

A substrate loading/unloading port 206 is installed adjacent to a gate valve 205 in a side surface of the lower vessel 202b, and the wafer 200 moves into and out of a transfer chamber (not shown) through the substrate loading/unloading port 206. A plurality of lift pins 207 are installed in a bottom portion of the lower vessel 202b. In addition, the lower vessel 202b is connected to a ground.

A substrate support 210 configured to support the wafer 200 is installed inside the process chamber 201. The substrate support 210 includes a mounting surface 211 having the wafer 200 mounted thereon, a substrate mounting stand 212 having the mounting surface 211 on a surface thereof, and a heater 213 as a heating part contained in the substrate mounting stand 212. Through holes 214 through which the lift pins 207 penetrate are formed at positions in the substrate mounting stand 212 corresponding to the lift pins 207, respectively.

The substrate mounting stand 212 is supported by a shaft 217. The shaft 217 penetrates through a bottom portion of the process vessel 202 and is also connected to an elevation mechanism 218 outside the process vessel 202. By operating the elevation mechanism 218 to raise or lower the shaft 217 and the substrate mounting stand 212, the wafer 200 mounted on the substrate mounting surface 211 can be raised or lowered. In addition, a periphery of a lower end of the shaft 217 is covered with a bellows 219, so that an interior of the process space 201 is maintained airtight.

The substrate mounting stand 212 is lowered such that the substrate mounting surface 211 is located at a position of the substrate loading/unloading port 206 (wafer transfer position) when the wafer 200 is transferred, and is raised such that the wafer 200 is located at a processing position (wafer processing position) in the process chamber 201 as shown in FIG. 1 when the wafer 200 is processed.

Specifically, when the substrate mounting stand 212 is lowered to the wafer transfer position, upper ends of the lift pins 207 protrude from the upper surface of the substrate mounting surface 211, and the lift pins 207 support the wafer 200 from below. In addition, when the substrate mounting stand 212 is raised to the wafer processing position, the lift pins 207 are sunken from the upper surface of the substrate mounting surface 211, and the substrate mounting surface 211 supports the wafer 200 from below. Further, since the lift pins 207 may be in direct contact with the wafer 200, they are preferably formed, for example, of quartz, alumina or the like.

(Exhaust System)

An exhaust port 221, as a first exhaust part configured to exhaust an atmosphere of the process chamber 201, is installed in a side surface of an inner wall of the process chamber 201 (the upper vessel 202a). An exhaust pipe 222 is connected to the exhaust port 221, and a pressure adjuster 223, such as an APC (Auto Pressure Controller) valve, configured to control the interior of the process chamber 201 to a predetermined pressure, and a vacuum pump 224 are serially connected to the exhaust pipe 222 in this order. A first exhaust system (exhaust line) is mainly configured with the exhaust port 221, the exhaust pipe 222, the pressure adjuster 223, and the vacuum pump 224.

(Gas Introduction Port)

A gas introduction port 241 configured to supply various types of gases into the process chamber 201 is installed in an upper surface (ceiling wall) of a shower head 234, which will be described later. The shower head 234 is installed at an upper portion of the process chamber 201. A configuration of a gas supply system connected to the gas introduction port 241 will be described later.

(Shower Head)

The shower head 234 as a gas dispersion mechanism is installed between the gas introduction port 241 and the process chamber 201. The gas introduction port 241 is connected to a lid 231 of the shower head 234, and the gas introduced from the gas introduction port 241 is supplied into a buffer space 232 of the shower head 234 through a hole 231a formed in the lid 231.

The shower head lid 231 is formed of a conductive metal and used as an electrode as an exciting part for exciting a gas into a plasma state in the buffer space 232 or the process chamber 201 as a plasma generation region. An insulation block 233 is installed between the lid 231 and the upper vessel 202a to insulate the lid 231 and the upper vessel 202a from each other. The electrode (the shower head lid 231) as the exciting part is configured to be supplied with electromagnetic power (high frequency power), which will be described later.

The shower head 234 includes a dispersion plate 234a, which is configured to disperse the gas introduced from the gas introduction port 241, between the buffer space 232 and the process chamber 201. The dispersion plate 234a has a plurality of gas through holes 234b formed therein. The dispersion plate 234a is disposed to face the substrate mounting surface 211.

A gas guide 240 configured to flow the supplied gas is installed in the buffer space 232. The gas guide 240 has a conical shape having a diameter increasing from the hole 231a toward the dispersion plate 234a. A horizontal diameter of a lower end of the gas guide 240 is determined such that the gas guide 240 extends to an outside of end portions of the gas through holes 234b.

An exhaust pipe 236 is connected to a flank of the buffer space 232 through a shower head exhaust port 235 as a second exhaust part. A valve 237 configured to switch the exhaust on/off, a pressure adjuster 238, such as an APC (Auto Pressure Controller) valve, configured to control an interior of the buffer space 232 to a predetermined pressure, and a vacuum pump 239 are serially connected to the exhaust pipe 236 in this order.

(Supply System)

A common gas supply pipe 242 is connected to the gas introduction port 241 connected to the lid 231 of the shower head 234. A first gas supply pipe 243a, a second gas supply pipe 244a, and a third gas supply pipe 245a are connected to the common gas supply pipe 242. The second gas supply pipe 244a is connected to the common gas supply pipe 242 through a remote plasma unit 244e.

A first element-containing gas is mainly supplied from a first gas supply system 243 including the first gas supply pipe 243a, and a second element-containing gas is mainly supplied from a second gas supply system 244 including the second gas supply pipe 244a. An inert gas is mainly supplied from a third gas supply system 245 including the third gas supply pipe 245a when the wafer 200 is processed, and a cleaning gas is also mainly supplied form the third gas supply system 245 when the process chamber 201 is cleaned.

(First Gas Supply System)

A first gas supply source 243b, a mass flow controller (MFC) 243c, which is a flow rate controller (flow rate control part), and a valve 243d, which is an opening/closing valve, are installed in the first gas supply pipe 243a in this order from an upstream direction.

A gas containing a first element (hereinafter, referred to as "a first element-containing gas") is supplied to the shower head 234 from the first gas supply pipe 243a through the mass flow controller 243c, the valve 243d, and the common gas supply pipe 242.

The first element-containing gas is a precursor gas, i.e., one of process gases.

Here, the first element is, for example, silicon (Si). That is, the first element-containing gas is, for example, a silicon-containing gas. The silicon-containing gas may include, for example, a dichlorosilane ($SiH_2Cl_2$: DCS) gas. In addition, the first element-containing gas may be in any one of solid, liquid and gaseous states under the normal temperature and pressure. When the first element-containing gas is in a liquid state under the normal temperature and pressure, a vaporizer (not shown) has only to be installed between the first gas supply source 243b and the mass flow controller 243c. Here, a case in which the first element-containing gas is in a gaseous state will be described.

A downstream end of the first inert gas supply pipe 246a is connected to the first gas supply pipe 243a at a downstream side of the valve 243d. An inert gas supply source 246b, a mass flow controller (MFC) 246c, which is a flow rate controller (flow rate control part), and a valve 246d, which is an opening/closing valve, are installed in the first inert gas supply pipe 246a in this order from an upstream direction.

Here, the inert gas is, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

The first element-containing gas supply system 243 (referred to as the silicon-containing gas supply system) is mainly configured with the first gas supply pipe 243a, the mass flow controller 243c, and the valve 243d.

Further, a first inert gas supply system is mainly configured with the first inert gas supply pipe 246a, the mass flow controller 246c, and the valve 246d. In addition, the inert gas supply source 246b and the first gas supply pipe 243a may also be included in the first inert gas supply system.

Furthermore, the first gas supply source 243b and the first inert gas supply system may also be included in the first element-containing gas supply system.

(Second Gas Supply System)

The remote plasma unit 244e as an exciting part may be installed at a downstream side of the second gas supply pipe 244a. A second gas supply source 244b, a mass flow controller (MFC) 244c, which is a flow rate controller (flow rate control part), and a valve 244d, which is an opening/closing valve, are installed in an upstream side of the second gas supply pipe 244a in this order from an upstream direction. The remote plasma unit 244e as the exciting part is configured to be supplied with electromagnetic power (high frequency power).

A gas containing a second element (hereinafter, referred to as "a second element-containing gas") is supplied into the shower head 234 from the second gas supply pipe 244a though the mass flow controller 244c, the valve 244d, the remote plasma unit 244e, and the common gas supply pipe 242. The second element-containing gas may be excited in a plasma generation region in the remote plasma unit 244e by the exciting part installed in the remote plasma unit 244e and supplied onto the wafer 200.

The second element-containing gas is one of the process gases. In addition, the second element-containing gas may be considered as a reaction gas or a modifying gas.

Here, the second element-containing gas contains a second element other than the first element. The second element is, for example, any one of oxygen (O), nitrogen (N), and carbon (C). In this embodiment, the second element-containing gas is, for example, a nitrogen-containing gas. Specifically, an ammonia ($NH_3$) gas is used as the nitrogen-containing gas.

The second element-containing gas supply system 244 (referred to as the nitrogen-containing gas supply system) is mainly configured with the second gas supply pipe 244a, the mass flow controller 244c, and the valve 244d.

In addition, a downstream end of the second inert gas supply pipe 247a is connected to the second gas supply pipe 244a at a downstream side of the valve 244d. An inert gas supply source 247b, a mass flow controller (MFC) 247c, which is a flow rate controller (flow rate control part), and a valve 247d, which is an opening/closing valve, are installed in the second inert gas supply pipe 247a in this order from an upstream direction.

An inert gas is supplied into the shower head 234 from the second inert gas supply pipe 247a through the mass flow controller 247c, the valve 247d, the second gas supply pipe 244a, and the remote plasma unit 244e. The inert gas acts as a carrier gas or a dilution gas in a film forming process.

A second inert gas supply system is mainly configured with the second inert gas supply pipe 247a, the mass flow controller 247c, and the valve 247d. In addition, the inert gas supply source 247b, the second gas supply pipe 244a, and the remote plasma unit 244e may also be included in the second inert gas supply system.

Furthermore, the second gas supply source 244b, the remote plasma unit 244e, and the second inert gas supply system may also be included in the second element-containing gas supply system 244.

(Third Gas Supply System)

A third gas supply source 245b, a mass flow controller (MFC) 245c, which is a flow rate controller (flow rate control part), and a valve 245d, which is an opening/closing valve, are installed in the third gas supply pipe 245a in this order from an upstream direction.

An inert gas as a purge gas is supplied to the shower head 234 from the third gas supply pipe 245a though the mass flow controller 245c, the valve 245d, and the common gas supply pipe 242.

Here, the inert gas is, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

A downstream end of the cleaning gas supply pipe 248a is connected to the third gas supply pipe 245a at a downstream side of the valve 245d. An cleaning gas supply source 248b, a mass flow controller (MFC) 248c, which is a flow rate controller (flow rate control part), and a valve 248d, which is an opening/closing valve, are installed in the cleaning gas supply pipe 248a in this order from an upstream direction.

The third gas supply system 245 (referred to as the silicon-containing gas supply system) is mainly configured with the third gas supply pipe 245a, the mass flow controller 245c, and the valve 245d.

Further, a cleaning gas supply system is mainly configured with the cleaning gas supply pipe 248a, the mass flow controller 248c and the valve 248d. In addition, the cleaning gas supply source 248b and the third gas supply pipe 245a may also be included in the cleaning gas supply system.

Furthermore, the third gas supply source 245b and the cleaning gas supply system may also be included in the third gas supply system 245.

In a substrate processing process, the inert gas is supplied into the shower head 234 from the third gas supply pipe 245a through the mass flow controller 245c, the valve 245d, and the common gas supply pipe 242. Further, in a cleaning process, the cleaning gas is supplied into the shower head 234 through the mass flow controller 248c, the valve 248d, and the common gas supply pipe 242.

In the substrate processing process, the inert gas supplied from the third gas supply source 245b acts as a purge gas which purges the process chamber 201 or the shower head 234 of the gas collected therein. Further, in the cleaning process, the inert gas may act as a carrier gas or a dilution gas of the cleaning gas.

The cleaning gas supplied from the cleaning gas supply source 248b acts as a cleaning gas which removes byproducts adhering to the shower head 234 or the process chamber 201 in the cleaning process.

Here, the cleaning gas is, for example, a nitrogen trifluoride ($NF_3$) gas. In addition, the cleaning gas may include, for example, a hydrogen fluoride (HF) gas, a chlorine trifluoride ($ClF_3$) gas, a fluorine ($F_2$) gas, and the like, or a combination thereof.

(Exciting Part)

The exciting part is configured with at least one of the first exciting part and the second exciting part.

The shower head lid 231 as the first exciting part is connected to a matching unit 251 and a high frequency power source 252. By supplying electromagnetic power (high frequency power) to the shower head lid 231 from the high frequency power source 252 through the matching unit 251 and controlling impedance in the matching unit 251, at least one of the first element-containing gas and the second element-containing gas described above are excited (into a plasma state).

In addition, when the first exciting part is used, in order to generate plasma containing at least one of the first element-containing gas and the second element-containing gas in the process chamber 201, an output power of the high frequency power source 252 or an internal pressure of the process chamber 201 is controlled.

The second exciting part is the remote plasma unit 244e.

(Plasma Generation Region)

The plasma generation region is configured by at least at least one of the process chamber 201 and the remote plasma unit 244e, as described above.

(Control Part)

As shown in FIG. 1, the substrate processing apparatus 100 includes a controller 121 configured to control the operations of the respective parts of the substrate processing apparatus 100.

Figure 2:
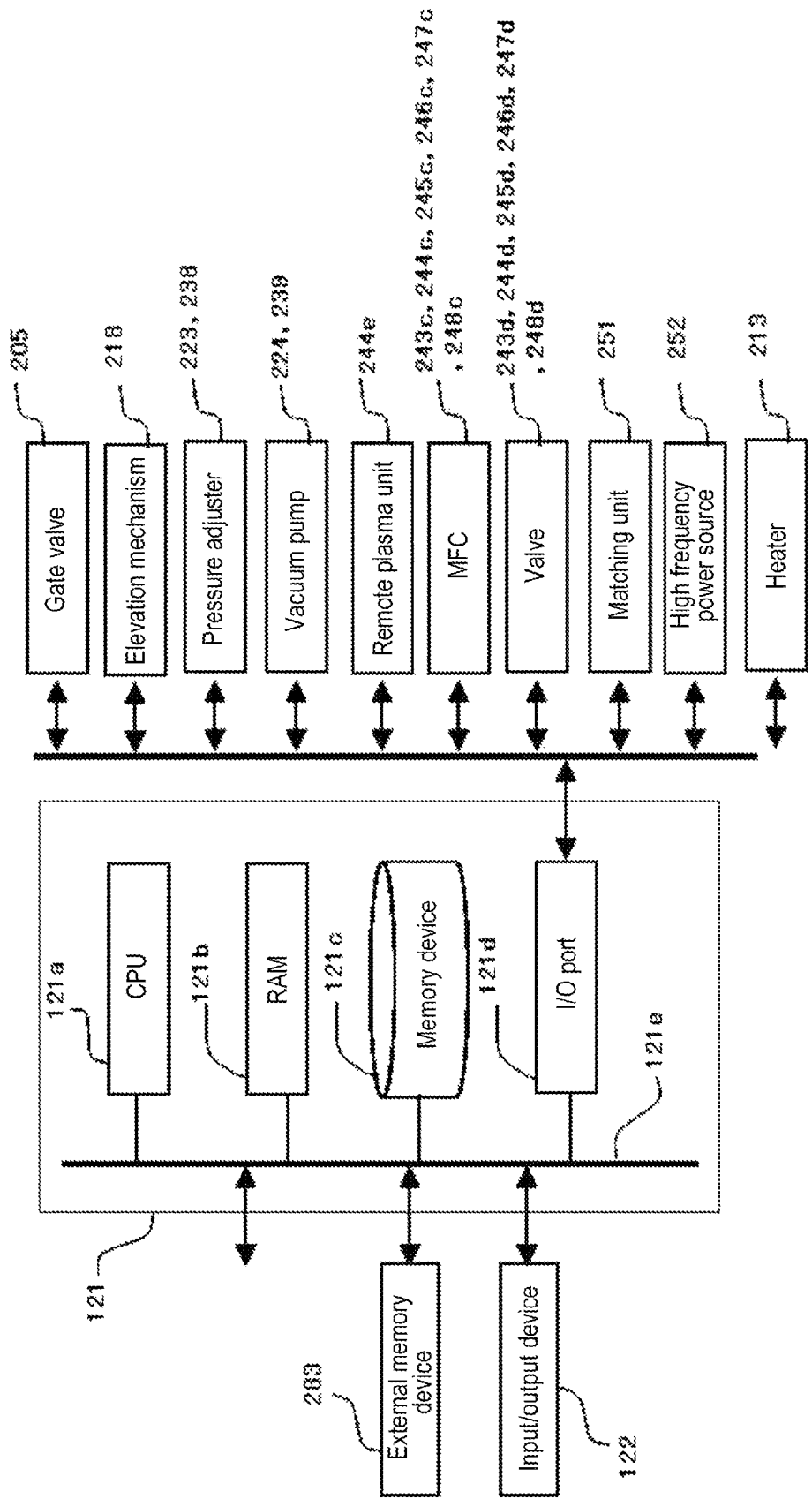
FIG. 2 is a schematic view illustrating a configuration of a controller of the substrate processing apparatus according to the embodiment of the present disclosure.

As illustrated in FIG. 2, the controller 121, which is a control unit (control part), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122 including, for example, a touch panel or the like, or an external memory device 283 is connected to the controller 121.

The memory device 121c is configured with, for example, a flash memory, an HDD (Hard Disc Drive), or the like. A control program for controlling operations of the substrate processing apparatus 100 or a process recipe, in which a sequence or condition for processing a substrate, which will be described later, is written, is readably stored in the memory device 121c. Also, the process recipe functions as a program for the controller 121 to execute each sequence in the substrate processing process, which will be described later, to obtain a predetermined result. Hereinafter, the process recipe or control program may be generally referred to as a program. Also, when the term "program" is used herein, it may include a case in which only the process recipe is included, a case in which only the control program is included, or a case in which both the process recipe and the control program are included. In addition, the RAM 121b is configured as a memory area (work area) in which a program or data read by the CPU 121a is temporarily stored.

The I/O port 121d is connected to the gate valve 205, the elevation mechanism 218, the pressure adjusters 223 and 238, the vacuum pumps 224 and 239, the remote plasma unit 244e, the MFCs 243c, 244c, 245c, 246c, 247c and 248c, the valves 243d, 244d, 245d, 246d, 247d and 248d, the matching unit 251, the high frequency power source 252, and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the opening/closing operation of the gate valve 205, the elevation operation of the elevation mechanism 218, the pressure controlling operation of the pressure adjusters 223 and 238, the on/off controlling operation of the vacuum pumps 224 and 239, the gas exciting operation of the remote plasma unit 244e, the flow rate controlling operation of the MFCs 243c, 244c, 245c, 246c, 247c and 248c, the on/off controlling operation of the valves 243d, 244d, 245d, 246d, 247d and 248d, the power matching operation of the matching unit 251, the on/off controlling operation of the high frequency power source 252, and the like according to contents of the read process recipe.

Moreover, the controller 121 is not limited to being configured as a dedicated computer but may be configured as a general-purpose computer. For example, the controller 121 according to the embodiment may be configured with preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to a case in which the program is supplied through the external memory device 283. For example, the program may be supplied using communication means such as the Internet or a dedicated line, rather than through the external memory device 283. Also, the memory device 121c or the external memory device 283 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 283 is included, or a case in which both the memory device 121c and the external memory device 283 are included.

(2) Substrate Processing Process

Next, a substrate processing process will be described with an example of forming a silicon nitride (SiN) film using a dichlorosilane (DCS) gas and an ammonia (NH$_3$) gas, which is one of processes of manufacturing a semiconductor device.

Figure 3:
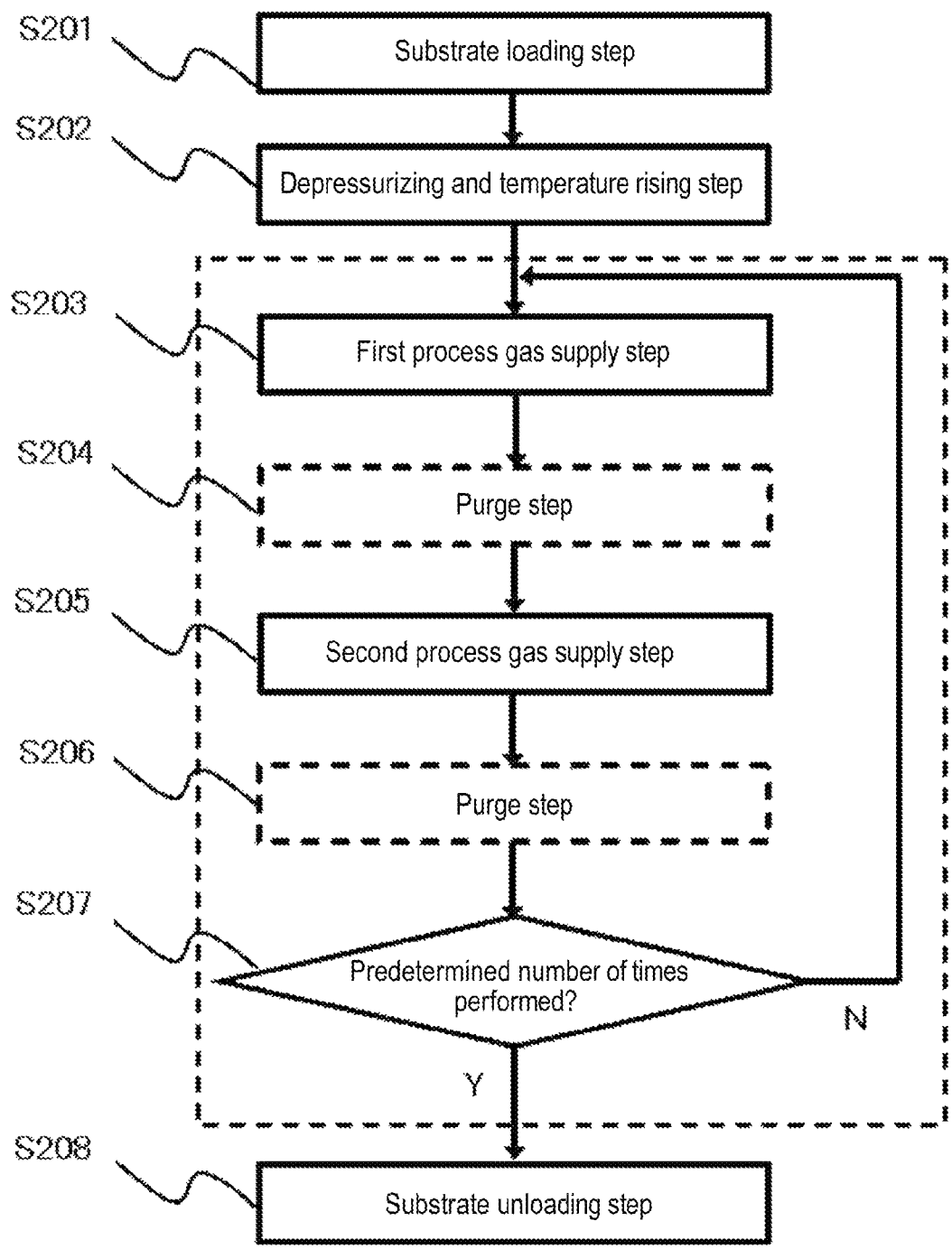
FIG. 3 is a flowchart illustrating a substrate processing process according to the embodiment of the present disclosure.

FIG. 3 is a sequence diagram illustrating an example of the substrate processing process performed by the substrate processing apparatus 100 according to the embodiment. The illustrated example shows a sequence operation in which an SiN film is formed on the wafer 200 as the substrate by performing processes using plasma.

(Substrate Loading Step S201)

When the film forming process is performed, first, the wafer 200 is loaded into the process chamber 201. Specifically, the substrate support 210 is lowered by the elevation mechanism 218, thereby allowing the lift pins 207 to protrude from the through holes 214 toward the upper side of the substrate support 210. In addition, after adjusting the interior of the process chamber 201 to a predetermined pressure, the gate valve 205 is opened and the wafer 200 is mounted on the lift pins 207 through the gate valve 205. After the wafer 200 is mounted on the lift pins 207, the substrate support 210 is raised to a predetermined position by the elevation mechanism 218, thereby mounting the wafer 200 from the lift pins 207 to the substrate support 210.

(Depressurizing and Temperature Rising Step S202)

Next, the interior of the process chamber 201 is exhausted through the exhaust pipe 222 such that the interior of the process chamber 201 reaches a desired pressure (vacuum level). At this time, a degree of the valve opening of the APC valve 223 is feedback-controlled based on a pressure value measured by a pressure sensor (not shown). In addition, an amount of power supplied to the heater 213 is feedback-controlled based on a temperature value measured by a temperature sensor (not shown) so that the interior of the process chamber 201 is set to a desired temperature. Specifically, the substrate mounting stand 212 is heated in advance, and the wafer 200 is maintained on the substrate mounting stand 212 for a predetermined period of time after there is no temperature change in the wafer 200 or the substrate mounting stand 212. In the meantime, moisture, gas, or the like emitted from members in the process chamber 201 is removed by vacuum exhausting or purging by supplying the N$_2$ gas. In this way, a preparation of the film forming process is completed. Further, in order to reduce the time for depressurizing the interior of the process chamber 201, the valve 237 is opened and the interior of the process chamber 201 may be exhausted by the vacuum pump 239 while the exhaust conductance is controlled by the APC valve 238.

(First Process Gas Supply Step S203)

Figure 4:
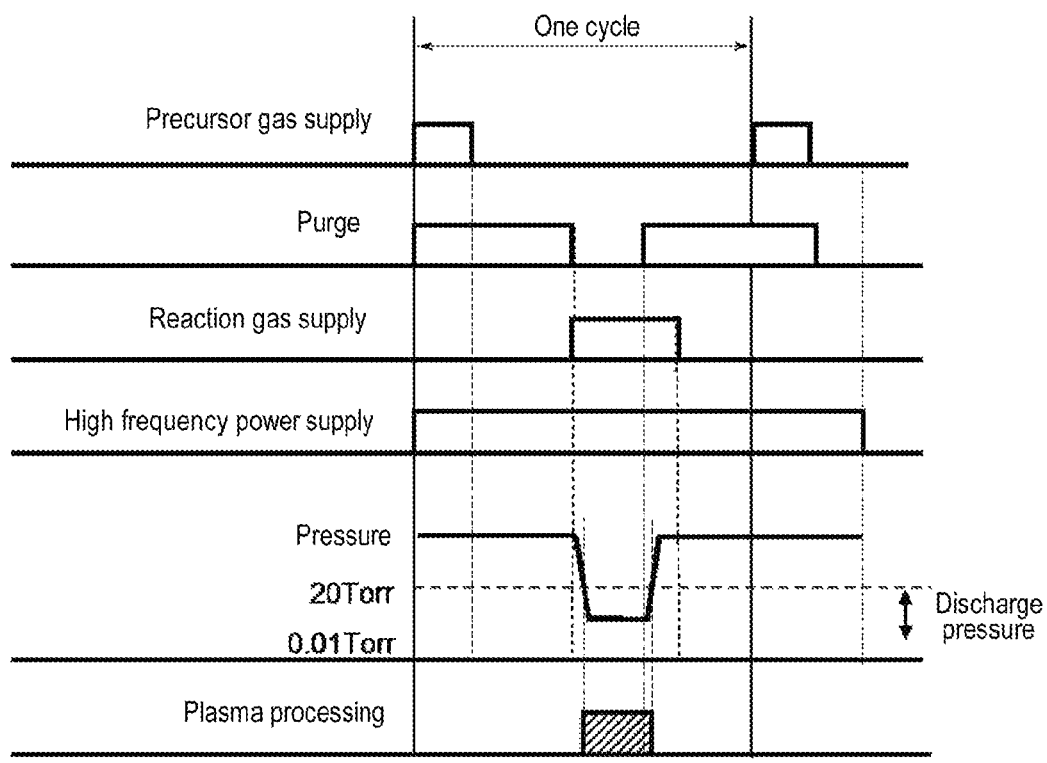
FIG. 4 shows a sequence example of supply and exhaust of gases and supply of high frequency power in the substrate processing process according to the embodiment of the present disclosure.

Subsequently, as shown in FIGS. 3 and 4, the DCS gas as the first process gas (precursor gas) is supplied into the process chamber 201 from the first process gas supply system. Then, the internal pressure of the process chamber 201 is controlled to a predetermined pressure (first pressure) by exhausting the interior of the process chamber 201 using the exhaust system. Specifically, the valve 243d of the first gas supply pipe 243a and the valve 246d of the first inert gas supply pipe 246a are opened to flow the DCS gas into the first gas supply pipe 243a and the N$_2$ gas into the first inert gas supply pipe 246a. The DCS gas flows from the first gas supply pipe 243a, and a flow rate of the DCS gas is controlled by the mass flow controller 243c. The N$_2$ gas flows from the first inert gas supply pipe 246a, and a flow rate of the N$_2$ gas is controlled by the mass flow controller 246c. The flow-rate-controlled DCS gas is mixed with the flow-rate-controlled N$_2$ gas in the first gas supply pipe 243a, supplied into the process chamber 201 in a heated and depressurized state through the gas through holes 234b of the shower head 234, and exhausted through the exhaust pipe 222. At this time, the DCS gas is supplied to the wafer 200 as the precursor gas (precursor gas supply step). The DCS gas is supplied into the process chamber 201 at a predetermined pressure (first pressure: for example, 100 Pa or more to 10000 Pa or less). In this way, the DCS gas is supplied to the wafer 200. As the DCS gas is supplied, a silicon-containing layer is formed on the wafer 200. The silicon-containing layer is a layer containing silicon (Si), or silicon and chlorine (Cl).

Figure 6:
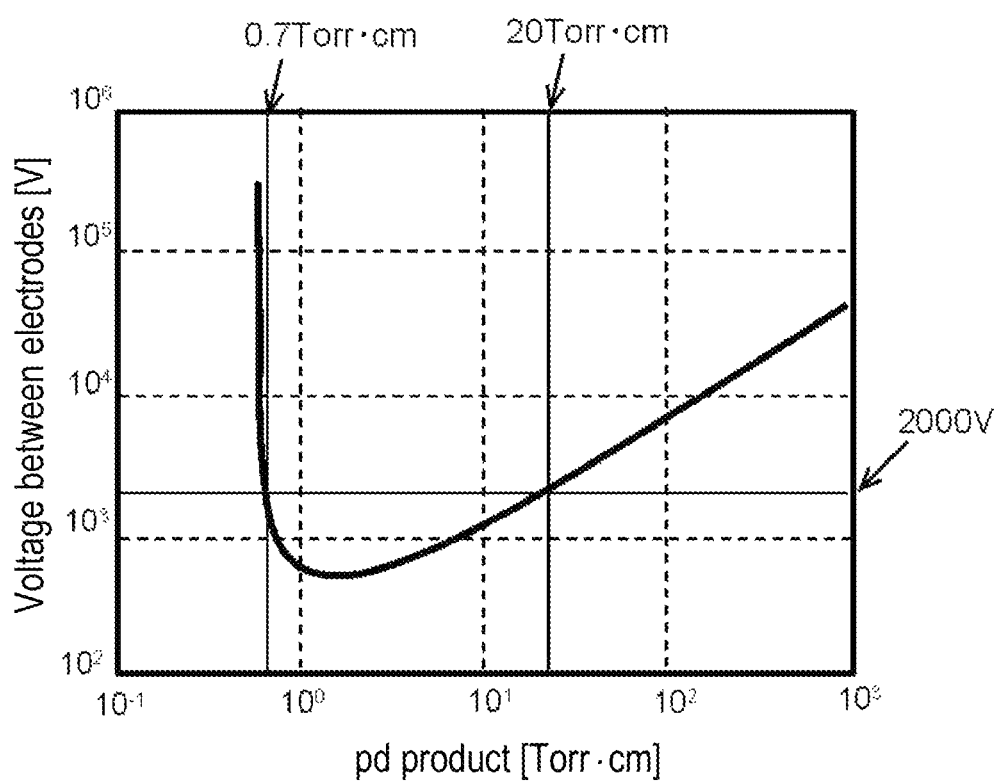
FIG. 6 is view illustrating discharge initiation properties of a $N_2$ gas according to the present disclosure.

In addition, as shown in FIG. 4, the process of supplying electromagnetic power (high frequency power) into the plasma generation region is initiated. Although the supply initiation of the electromagnetic power is performed simultaneously with the supply initiation of the precursor gas in FIG. 4, the electromagnetic power may be supplied at least before the reaction gas is supplied. The process of supplying electromagnetic power is continued until a cycle from the first process gas supply step S203 to a purge step S206 (to be described later) is repeated a predetermined number of times (Yes in step S207). In the first process gas supply step S203, a pressure (first pressure) in the plasma generation region is set such that the precursor gas is not excited into a plasma state (i.e., the precursor gas is maintained in a plasma off state) in spite of a pressure rising mainly due to the process of supplying the purge gas, for example, by adjusting the electromagnetic power (voltage) and a distance between the electrodes based on the Paschen's law. At this time, when the RF power supplied through the matching unit 251 is supplied to the lid 231, the matching unit 251 is set in advance such that a voltage generated between the lid 231 and the substrate mounting stand 212 is not increased to 2000V or more. For example, as illustrated in FIG. 6 that shows N$_2$ (nitrogen) discharge initiation properties, a pd product (p: pressure, d: distance between electrodes) is made to be more than 20 Torr·cm by adjusting the supply amount of the purge gas.

(Purge Step S204)

After the silicon-containing layer is formed on the wafer 200, the valve 243d of the first gas supply pipe 243a is closed to stop the process of supplying the DCS gas. At this time, while the APC valve (pressure adjuster) 223 of the exhaust pipe 222 is in an open state, the interior of the process chamber 201 is vacuum exhausted by the vacuum pump 224, and a residual DCS gas remaining in the process chamber 201 which does not react or remains after contributing to the formation of the silicon-containing layer is removed from the process chamber 201. At this time, the valve 246d is in an open state, and the process of supplying the N$_2$ gas as the inert gas into the process chamber 201 is maintained. The N$_2$ gas acts as a purge gas. Thus, the residual DCS gas remaining in the process chamber 201, which does not react or remains after contributing to the formation of the silicon-containing layer can more effectively be removed from the process chamber 201. In addition, the valve 237 may be opened to exhaust the interior of the shower head 234 through the APC valve 238 by the vacuum pump 239. With this configuration, the residual DCS gas remaining in the shower head 234, which does not react or remains after contributing to the formation of the silicon-containing layer can be removed from the shower head 234. In this step S204, the pd product in the process chamber 201 is always maintained at 20 Torr·cm or more in the same manner as the first process gas supply step S203.

Moreover, in this case, the gas remaining in the process chamber 201 or the shower head 234 may not completely be removed, and the interior of the process chamber 201 may not completely be purged. When the gas remaining in the process chamber 201 is very small in amount, there is no adverse effect generated in a subsequent step performed thereafter. Here, the amount of the $N_2$ gas supplied into the process chamber 201 need not be large, and for example, approximately the same amount of the $N_2$ gas as the volume of the process chamber 201 may be supplied to perform the purge step such that there is no adverse effect generated in the subsequent step. As described above, as the interior of the process chamber 201 is not completely purged, the purge time can be reduced, thereby improving the throughput. In addition, the consumption of the $N_2$ gas can also be suppressed to a minimal necessity.

However, in order to improve the coverage, film quality, or film thickness uniformity, it is preferred that the interior of the process chamber 201 be sufficiently exhausted.

The temperature of the heater 213 at this time is set to a constant temperature within a range of, for example, 300 to 650 degrees C., specifically, in a range of 300 to 600 degrees C., or more specifically, in a range of 300 to 550 degrees C., in the same manner as when the precursor gas is supplied to the wafer 200. A supply flow rate of the $N_2$ gas as the purge gas supplied from each inert gas supply system is set to fall within a range of, for example, 100 to 20000 sccm. The purge gas may include a rare gas such as an Ar gas, a He gas, a Ne gas, a Xe gas, and the like, in addition to the $N_2$ gas.

In this purge step S204, it is essential to continuously supply the electromagnetic power and to set the pd product to 20 Torr·cm or more in order not to generate plasma in the process chamber 201.

(Second Process Gas Supply Step S205)

After the residual DCS gas remaining in the process chamber 201 is removed, the process of supplying the purge gas is stopped, and the $NH_3$ gas as the second process gas (reaction gas) is supplied. Specifically, the valve 244d of the second gas supply pipe 244a is opened to flow the $NH_3$ gas into the second gas supply pipe 244a. A flow rate of the $NH_3$ gas flowing in the second gas supply pipe 244a is controlled by the mass flow controller 244c. The flow-rate-controlled $NH_3$ gas is supplied into the shower head 234 through the remote plasma unit 244e and the common gas supply pipe 242. In addition, the internal pressure of the process chamber 201 is controlled to a second pressure (dischargeable pressure). Here, a voltage generated by the RF power supplied to the lid 231 through the matching unit 251 is maintained at 2000 V or less. The voltage generated by the RF power supplied to the lid 231 may be maintained at a value close to 2000 V. In such a state, by reducing the process of supplying the purge gas, the internal pressure of the process chamber 201 is decreased to the second pressure lower than the first pressure and the pd product is set to 20 Torr·cm or less, thereby generating plasma in the process chamber 201.

In addition, flow rates of the purge gas and the second process gas at this time are set such that when a flow rate (supply amount) of the second process gas is 1, a flow rate of the purge gas is 10 to 100. The flow rate of each gas is controlled by an opening/closing time of the valve corresponding to each gas, and a time of opening the valve corresponding to the second process gas is set to fall within a range of, for example, 0.1 to 1 second.

Figure 5:
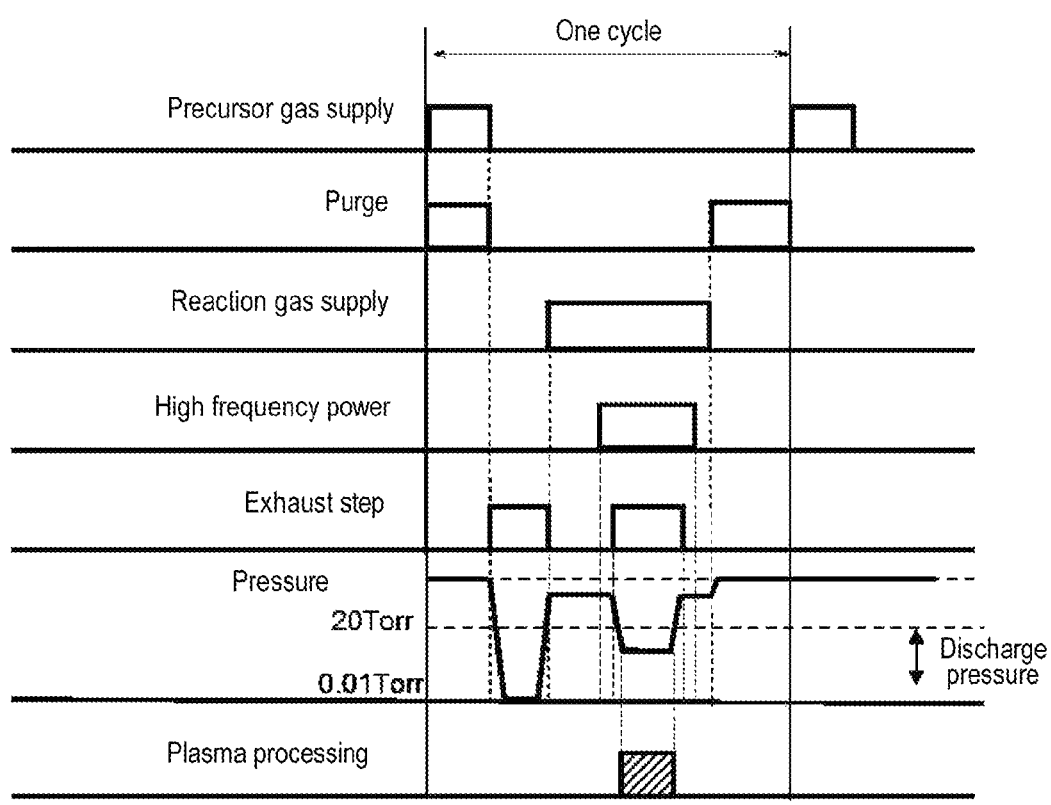
FIG. 5 shows a sequence example of supply and exhaust of gases and supply of high frequency power in a substrate processing process according to another embodiment of the present disclosure.

In addition, although the RF power is shown to be supplied from a time at which the process of supplying the precursor gas is initiated in FIG. 4, the RF power may be supplied immediately after a time at which the process of supplying the reaction gas is initiated as shown in FIG. 5.

When the $NH_3$ gas as the reaction gas is excited into a plasma state to generate activated $NH_3$ gas (plasma or radical of the $NH_3$ gas), it reacts with the silicon-containing film formed on the wafer 200, thereby enabling a silicon nitride film to be formed. In addition, when the pressure in the plasma generation region is reduced while the reaction gas is supplied, an exhaust amount may be increased using the shower head exhaust port 235 as the second exhaust part.

(Purge Step S206)

After the second process gas supply step S205, the generation of plasma is stopped by supplying the purge gas to increase the internal pressure of the process chamber 201 and to meet the pd product>>20 Torr·cm, and simultaneously, the process of supplying the reaction gas is stopped. Thereafter, a purge step S206 that is the same step as the purge step S204 is performed. By performing the purge step S206, a residual $NH_3$ gas remaining in the process chamber 201 which does not react or remains after the silicon-containing layer is formed can be removed from the process chamber 201. Also, in the same manner as the purge step S204, the valve 237 may be opened to exhaust the interior of the shower head 234 through the APC valve 238 by the vacuum pump 239. With this configuration, the residual gas remaining in the shower head 234 which does not react or remains after the silicon nitride film is formed can be removed from the shower head 234. As the residual gas is removed, it is possible to prevent an unexpected film from being formed by the residual gas.

(Repetition Step S207)

As the first process gas supply step S203, the purge step S204, the second process gas supply step S205, and the purge step S206 are performed, a film having a predetermined thickness is deposited on the wafer 200. By repeating these steps, it is possible to control the thickness of the film deposited on the wafer 200. The number of times the steps are repeated is controlled until a desired film thickness is obtained.

(Substrate Unloading Step S208)

After the steps are performed a predetermined number of times in the repetition step S207, a substrate unloading step S208 is performed, and the wafer 200 is unloaded from the process chamber 201. Specifically, the temperature in the process chamber 201 is lowered to a temperature at which the wafer 200 can be unloaded from the process chamber 201 (unloadable temperature), and the interior of the process chamber 201 is purged with the inert gas to be adjusted to a pressure at which the wafer 200 can be transferred from the process chamber 201 (transferable pressure). After the pressure adjustment, the substrate support 210 is lowered by the elevation mechanism 218, the lift pins 207 protrude from the through holes 214, and the wafer 200 is mounted on the lift pins 207. After the wafer 200 is mounted on the lift pins 207, the gate valve 205 is opened, and the wafer 200 is unloaded from the process chamber 201.

(3) Effects According to the Embodiment

According to the embodiment, one or more of the following effects are expected.

(a) Since the high frequency power is supplied in advance and only the reaction gas is excited into a plasma state by the supply pressure of the reaction gas, an on/off switching time of plasma can be reduced.

(b) In addition, in the purge step, the interior of the shower head 234 may be exhausted, thereby enabling the purge time to be reduced.

(c) As the internal pressure of the process chamber 201 is lowered in a state where the high frequency power is supplied, the on/off switching time of plasma can be reduced.

(d) As the internal pressure of the process chamber 201 is lowered in a state where the high frequency power is supplied, the pressure can be raised in the purge step or the first gas supply step, thereby enabling the purge time to be reduced.

When the pressure is lowered in the purge step or the first gas supply step, the processing time of each step is increased and thus a throughput is deteriorated.

(e) As plasma is generated by lowering the pressure, it is possible to prevent unintended plasma from being generated.

Second Embodiment of the Present Disclosure

Hereinabove, the embodiment of the present disclosure has been specifically described, but the present disclosure is not limited to the above-described embodiment and may be variously modified without departing from the spirit of the present disclosure.

For example, FIG. 5 shows an example of a gas supply sequence according to a second embodiment of the present disclosure. In FIG. 5, after a precursor gas supply step (first process gas supply step) and a purge step are performed, an exhaust step is performed to remove the precursor gas. Thereafter, a reaction gas supply step and an electromagnetic power supply step are sequentially performed. After the process of supplying the electromagnetic power, the internal pressure of the process chamber 201 is controlled to a dischargeable pressure by the exhaust part, thereby initiating the excitation of the reaction gas. With this configuration, it is possible to initiate the gas excitation by varying the pressure.

Third Embodiment of the Present Disclosure

While the above-described embodiments have been described with respect to the configuration of the substrate processing apparatus 100 shown in FIG. 1, the present disclosure is not limited to the above-described configuration and may be variously modified without departing from the spirit of the present disclosure.

Figure 7:
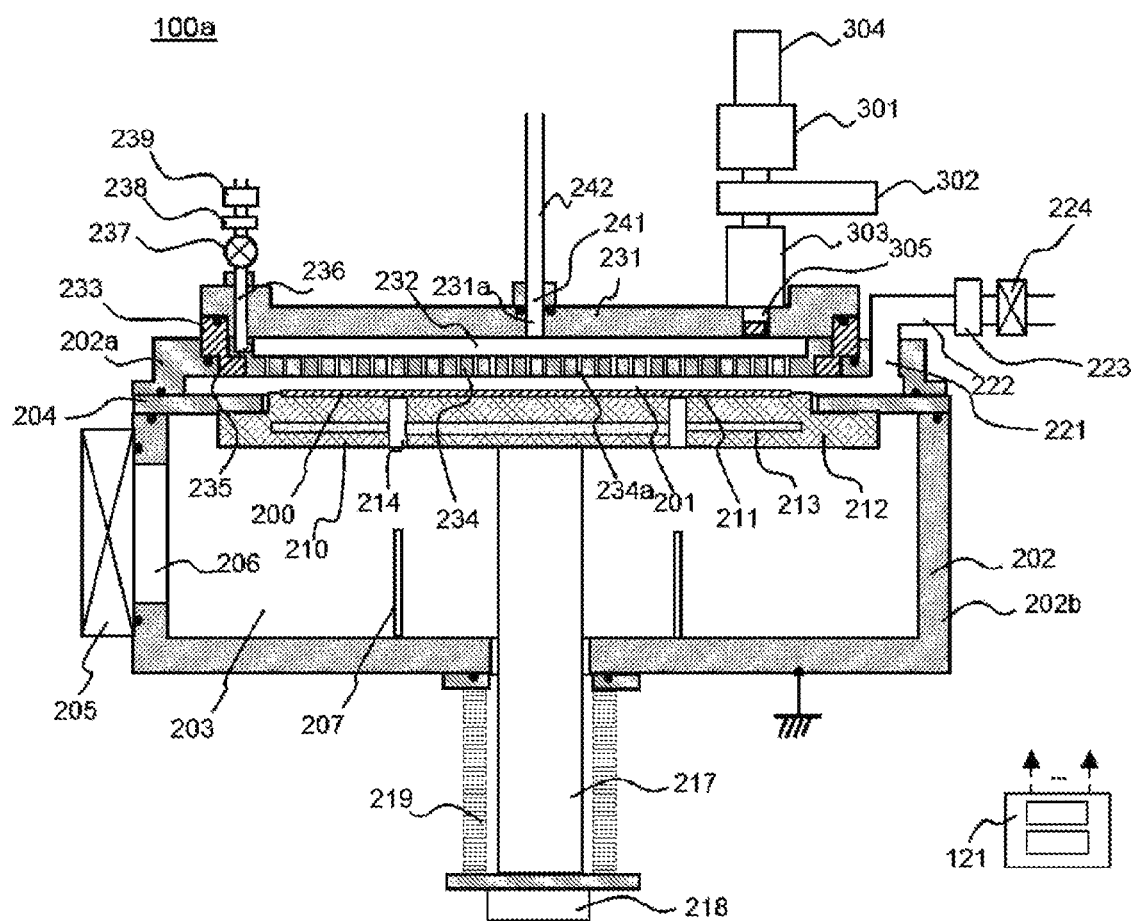
FIG. 7 is a schematic view illustrating a substrate processing apparatus according to still another embodiment of the present disclosure.

For example, FIG. 7 shows a configuration of a substrate processing apparatus 100a according to a third embodiment of the present disclosure. In FIG. 7, a microwave introduction window 305 is provided as an electrode of the exciting part. The microwave introduction window 305 is configured such that electromagnetic power (microwave power) is supplied to the microwave introduction window 305 from a microwave source 304 through a magnetron 301, an isolator 302, a matching unit 303 and the like. As the microwave is supplied in this way, the high frequency power can be supplied into the buffer space 232, and the gas supplied into the buffer space 232 can be excited into a plasma state. In addition, if no plasma is generated when the electromagnetic power is supplied as in the above-described FIG. 4 or 5, a reflected wave is increased. However, the reflected wave is absorbed in the isolator 302, thereby reducing damages to the microwave source 304. A gas supply timing, an electromagnetic power supply timing, or an exhaust timing may be configured in the same manner as FIG. 4 or 5.

In addition, while it has been described as an example in the above that when the plasma is generated by controlling the pressure, the pressure is controlled by a flow rate of the gas, the pressure may be controlled by a combination of the control of the gas flow rate and the control of the exhaust amount. Such a combination can reduce the time required for the pressure control. In addition, the time may also be reduced by making a volume of the plasma generation region small. Further, the above-described second exhaust part may be used to reduce the exhaust time.

In addition, while the process of manufacturing a semiconductor device has been described in the above, the present disclosure according to the embodiment may be applied to those other than the process of manufacturing a semiconductor device. For example, the present disclosure may be applied to a process of manufacturing a liquid crystal device, a process of plasma-processing a ceramic substrate, and the like.

Further, while the method of forming a film by alternately supplying the precursor gas and the reaction gas has been described in the above, the present disclosure may also be applied to other methods. For example, the precursor gas and the reaction gas may be supplied such that supply timings thereof overlap each other.

Furthermore, while the film formation processing has been described in the above, the present disclosure may also be applied to other processing. For example, the present disclosure may be applied to substrate processing such as plasma oxidation processing or plasma nitriding processing of a substrate surface or a film formed on a substrate only using the reaction gas. In addition, the present disclosure may also be applied to plasma annealing processing only using the reaction gas.

Furthermore, while the single-wafer type apparatus has been described in the above, the present disclosure is not limited thereto and may be applied to a vertical type apparatus configured to process a plurality of substrates vertically arranged. Also, the present disclosure may also be applied to a processing apparatus in which a plurality of substrates are horizontally arranged.

Aspects of the Present Disclosure

Hereinafter, some aspects of the present disclosure will be additionally stated.

Supplementary Note 1

According to an aspect of the present disclosure, there is provided a method of manufacturing a semiconductor device, including: supplying a precursor gas to a substrate; supplying a reaction gas to a plasma generation region; supplying high frequency power to the plasma generation region; and generating plasma of the reaction gas by adjusting a pressure of the plasma generation region to a first pressure before the reaction gas is supplied and adjusting the pressure of the plasma generation region to a second pressure lower than the first pressure while the reaction gas and the high frequency power are supplied.

Supplementary Note 2

In the method of manufacturing a semiconductor device according to Supplementary Note 1, after the act of supplying the high frequency power to the plasma generation region is initiated, the reaction gas is supplied to the plasma generation region and the pressure in the plasma generation region is adjusted from the first pressure to the second pressure, thereby generating the plasma.

Supplementary Note 3

The method of manufacturing a semiconductor device according to Supplementary Note 1 or 2, further including supplying a purge gas before the reaction gas is supplied, wherein a supply amount of the purge gas is larger than that of the reaction gas.

Supplementary Note 4

The method of manufacturing a semiconductor device according to any one of Supplementary Notes 1 to 3, further including returning the reaction gas from a plasma state to a gaseous state after the act of generating the plasma.

Supplementary Note 5

In the method of manufacturing a semiconductor device according to Supplementary Note 4, the act of generating the plasma and the act of returning the reaction gas to the gaseous state are alternately performed.

Supplementary Note 6

In the method of manufacturing a semiconductor device according to any one of Supplementary Notes 1 to 5, the first pressure is a pressure where the reaction gas is maintained in a plasma off state.

Supplementary Note 7

In the method of manufacturing a semiconductor device according to any one of Supplementary Notes 1 to 6, the second pressure is a pressure where the reaction gas is excited into a plasma state.

Supplementary Note 8

According to another aspect of the present disclosure, there is provided a substrate processing apparatus, including: a process chamber configured to accommodate a substrate therein; a precursor gas supply part configured to supply a precursor gas to the substrate; a reaction gas supply part configured to supply a reaction gas to the substrate; a plasma generation region to which the reaction gas is supplied to excite the reaction gas into a plasma state; an exciting part configured to supply high frequency power to the plasma generation region; and a control part configured to control the reaction gas supply part and the exciting part such that the reaction gas is excited into the plasma state by adjusting a pressure of the plasma generation region to a first pressure before the reaction gas is supplied and adjusting the pressure of the plasma generation region to a second pressure lower than the first pressure while the reaction gas and the high frequency power are supplied.

Supplementary Note 9

The substrate processing apparatus according to Supplementary Note 8, further including an exhaust part configured to exhaust the process chamber, wherein the control part is configured to control the reaction gas supply part and the exhaust part such that after the act of supplying the high frequency power to the plasma generation region is initiated, the reaction gas is supplied to the plasma generation region and the pressure in the plasma generation region is adjusted from the first pressure to the second pressure.

Supplementary Note 10

The substrate processing apparatus according to Supplementary Note 8 or 9, further including a purge gas supply part configured to supply a purge gas to the process chamber, wherein the control part is configured to control the reaction gas supply part and the purge gas supply part such that a purge gas is supplied before the reaction gas is supplied, and a supply amount of the purge gas is larger than that of the reaction gas.

Supplementary Note 11

In the substrate processing apparatus according to any one of Supplementary Notes 8 to 10, the control part is configured to control the exciting part and the reaction gas supply part such that the reaction gas is returned from the plasma state to a gaseous state in a state where the high frequency power is continuously supplied after the plasma is generated.

Supplementary Note 12

In the substrate processing apparatus according to any one of Supplementary Notes 8 to 11, the control part is configured to control the exciting part and the reaction gas supply part such that the act of generating the plasma and the act of returning the reaction gas to the gaseous state are alternately performed.

Supplementary Note 13

In the substrate processing apparatus according to any one of Supplementary Notes 9 to 12, the control part is configured to control at least one of the reaction gas supply part and the exhaust part such that the first pressure is a pressure where the reaction gas is maintained in a plasma off state.

Supplementary Note 14

In the substrate processing apparatus according to any one of Supplementary Notes 9 to 13, the control part is configured to control at least one of the reaction gas supply part and the exhaust part such that the second pressure is a pressure where the reaction gas is excited into the plasma state.

Supplementary Note 15

According to still another aspect of the present disclosure, there is provided a program that causes a computer to perform processes of: supplying a precursor gas to a substrate; supplying a reaction gas to a plasma generation region; supplying high frequency power to the plasma generation region; and generating plasma of the reaction gas by adjusting a pressure of the plasma generation region to a first pressure before the reaction gas is supplied and adjusting the pressure of the plasma generation region to a second pressure lower than the first pressure while the reaction gas and the high frequency power are supplied.

Supplementary Note 16

In the program according to Supplementary Note 15, after the act of supplying the high frequency power to the plasma generation region is initiated, the reaction gas is supplied to the plasma generation region and the pressure in the plasma generation region is adjusted from the first pressure to the second pressure, thereby generating the plasma.

Supplementary Note 17

The program according to Supplementary Note 15 or 16, further including supplying a purge gas before the reaction gas is supplied, wherein a flow rate of the purge gas is larger than that of the reaction gas.

Supplementary Note 18

The program according to any one of Supplementary Notes 15 to 17, further including returning the reaction gas from a plasma state to a gaseous state after the act of generating the plasma.

Supplementary Note 19

In the program according to any one of Supplementary Notes 15 to 18, the act of generating the plasma and the act of returning the reaction gas to the gaseous state are alternately performed.

Supplementary Note 20

In the program according to any one of Supplementary Notes 15 to 19, the first pressure is a pressure where the reaction gas is maintained in a plasma off state.

Supplementary Note 21

In the program according to any one of Supplementary Notes 15 to 20, the second pressure is a pressure where the reaction gas is excited into a plasma state.

Supplementary Note 22

According to still another aspect of the present disclosure, there is provided a non-transitory computer-readable recording medium storing a program that causes a computer to perform processes of: supplying a precursor gas to a substrate; supplying a reaction gas to a plasma generation region; supplying high frequency power to the plasma generation region; and generating plasma of the reaction gas by adjusting a pressure of the plasma generation region to a first pressure before the reaction gas is supplied and adjusting the pressure of the plasma generation region to a second pressure lower than the first pressure while the reaction gas and the high frequency power are supplied.

According to the present disclosure in some embodiments, there may be provided a method of manufacturing a semiconductor device, a substrate processing apparatus and a recording medium, which make it possible to improve properties of a film formed on a substrate and to increase a manufacturing throughput.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    supplying a precursor gas to a substrate;
    supplying a reaction gas to a plasma generation region;
    supplying high frequency power to the plasma generation region; and
    generating plasma of the reaction gas, after the act of supplying the high frequency power to the plasma generation region is initiated, by supplying the reaction gas to the plasma generation region and adjusting a pressure in the plasma generation region from a first pressure to a second pressure lower than the first pressure.

2. The method of claim 1, further comprising supplying a purge gas before the reaction gas is supplied, wherein a supply amount of the purge gas is larger than that of the reaction gas.

3. The method of claim 1, further comprising returning the reaction gas from a plasma state to a gaseous state after the act of generating the plasma.

4. The method of claim 3, wherein the act of generating the plasma and the act of returning the reaction gas to the gaseous state are alternately performed.

5. The method of claim 1, wherein the first pressure is a pressure where the reaction gas is maintained in a plasma off state.

6. The method of claim 1, wherein the second pressure is a pressure where the reaction gas is excited into a plasma state.

7. A substrate processing apparatus, comprising:
    a process chamber configured to accommodate a substrate therein;
    a precursor gas supply part configured to supply a precursor gas to the substrate;
    a reaction gas supply part configured to supply a reaction gas to the substrate;
    a plasma generation region to which the reaction gas is supplied to excite the reaction gas into a plasma state;
    an exciting part configured to supply high frequency power to the plasma generation region before the reaction gas supply part supplies the reaction gas to the plasma generation region; and
    a control part configured to control the reaction gas supply part and the exciting part such that after supplying of the high frequency power to the plasma generation region is initiated, a plasma of the reaction gas is generated by supplying the reaction gas to the plasma generation region and adjusting a pressure in the plasma generation region from a first pressure to a second pressure lower than the first pressure.

8. The substrate processing apparatus of claim 7, further comprising a purge gas supply part configured to supply a purge gas to the process chamber, wherein the control part is configured to control the reaction gas supply part and the purge gas supply part such that a purge gas is supplied before the reaction gas is supplied, and a supply amount of the purge gas is larger than that of the reaction gas.

9. The substrate processing apparatus of claim 7, wherein the control part is configured to control the exciting part and the reaction gas supply part such that the reaction gas is returned from the plasma state to a gaseous state in a state where the high frequency power is continuously supplied after the plasma is generated.

10. The substrate processing apparatus of claim 7, wherein the control part is configured to control the exciting part and the reaction gas supply part such that the act of generating the plasma and the act of returning the reaction gas to the gaseous state are alternately performed.

11. The substrate processing apparatus of claim 7, wherein the control part is configured to control at least one of the reaction gas supply part and the exhaust part such that the first pressure is a pressure where the reaction gas is maintained in a plasma off state.

12. The substrate processing apparatus of claim 7, wherein the control part is configured to control at least one of the reaction gas supply part and the exhaust part such that the second pressure is a pressure where the reaction gas is excited into the plasma state.

13. A non-transitory computer-readable recording medium storing a program that causes a computer to perform processes of:
supplying a precursor gas to a substrate;
supplying a reaction gas to a plasma generation region;
supplying high frequency power to the plasma generation region; and
generating plasma of the reaction gas, after the act of supplying the high frequency power to the plasma generation region is initiated, by supplying the reaction gas to the plasma generation region and adjusting a pressure in the plasma generation region from a first pressure to a second pressure lower than the first pressure.

14. The non-transitory computer-readable recording medium of claim 13, wherein the process further includes supplying a purge gas before the reaction gas is supplied, and wherein a supply amount of the purge gas is larger than that of the reaction gas.

15. The non-transitory computer-readable recording medium of claim 13, wherein the process further includes returning the reaction gas from a plasma state to a gaseous state after the act of generating the plasma.

16. The non-transitory computer-readable recording medium of claim 15, wherein the act of generating the plasma and the act of returning the reaction gas to the gaseous state are alternately performed.

17. The method of claim 1, further comprising:
supplying a purge gas under the first pressure after the act of supplying the precursor gas and before the act of supplying the reaction gas.

18. The substrate processing apparatus of claim 7, further comprising:
a purge gas supply part configured to supply a purge gas to the substrate,
wherein the control part is further configured to supply the purge gas under the first pressure after the precursor gas is supplied and the reaction gas is supplied.

19. The non-transitory computer-readable recording medium of claim 13, wherein the process further includes supplying a purge gas under the first pressure after the act of supplying the precursor gas and before the act of supplying the reaction gas.

* * * * *